(12) United States Patent
Kim

(10) Patent No.: US 7,554,878 B2
(45) Date of Patent: *Jun. 30, 2009

(54) SYNCHRONOUS MEMORY DEVICE

(75) Inventor: Youn-cheul Kim, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 0 days.

This patent is subject to a terminal disclaimer.

(21) Appl. No.: 11/511,678

(22) Filed: Aug. 29, 2006

(65) Prior Publication Data

US 2007/0047340 A1    Mar. 1, 2007

(30) Foreign Application Priority Data

Aug. 29, 2005    (KR) ...................... 10-2005-0079541

(51) Int. Cl.
G11C 8/02 (2006.01)
(52) U.S. Cl. .................... 365/232; 365/189.05; 365/194
(58) Field of Classification Search ................. 365/232, 365/189.05, 194
See application file for complete search history.

(56) References Cited

U.S. PATENT DOCUMENTS

| 2004/0081013 | A1  | 4/2004 | Lee et al. |
| 2006/0077751 | A1* | 4/2006 | Oh et al. ..................... 365/232 |

FOREIGN PATENT DOCUMENTS

| JP | 2000-293259 | 10/2000 |
| JP | 2003-044349 | 2/2003 |
| KR | 1020040095956 | 11/2004 |

* cited by examiner

Primary Examiner—Hoai V Ho
Assistant Examiner—Jason Lappas
(74) Attorney, Agent, or Firm—F. Chau & Assoc., LLC

(57) ABSTRACT

A synchronous memory device, which includes a read command buffer, a replica circuit, and a latency circuit. The read command buffer provides a read signal in response to a read command. The replica circuit provides a transfer signal whose time difference with respect to the feedback clock signal is substantially identical to a period that it takes a read command buffer to provide the read signal. The latency circuit receives the read signal, and provides a latency signal having a difference of a predetermined time corresponding to CAS latency with respect to the read signal in response to the transfer signal.

3 Claims, 6 Drawing Sheets

SYNCHRONOUS MEMORY DEVICE

CROSS-REFERENCE TO RELATED PATENT APPLICATION

This application claims priority to Korean Patent Application No. 10-2005-0079541, filed on Aug. 29, 2005, the disclosure of which is herein incorporated by reference in its entirety.

BACKGROUND OF THE INVENTION

1. Technical Field

The present disclosure relates to a synchronous memory device and, more particularly to a synchronous memory device having improved operational characteristics.

2. Discussion of Related Art

A synchronous memory device inputs and outputs data in synchronization with external clock signals. Since the external interface of a synchronous memory device is synchronized with an external clock signal, a controller can preset a clock cycle at which valid data can be output after the issuance of a read command.

In general, Column Access Strobe (CAS) latency is the time from the point at which a read command is applied to a synchronous memory device to the point at which data is output, which is represented using a multiple of an external clock signal cycle tCC. That is, data is output from a synchronous memory device after a certain number of clock cycles corresponding to the CAS latency after the reception of the read command (or a column address applied along with the read command). For example, if the CAS latency is five, data must be output five cycles after the external clock cycle when the read command was applied.

FIG. 1 is a block diagram illustrating a conventional synchronous memory device.

Referring to FIG. 1, the conventional synchronous memory device 1 includes a memory cell array 10, a data output buffer 20, a clock recovery circuit 30, a replica circuit 40, a read command buffer 50, a clock delay circuit 70, a mode register 80, and a latency circuit 90.

When a read command READ CMD is provided to the synchronous memory device 1, data DATA is output from the memory cell array 10 corresponding to an externally-provided address ADDRESS. The data output buffer 20 outputs the data DATA received from the memory cell array 10 in response to a latency signal LATENCY and a data output clock signal CLKDQ. The data output buffer 20 of the synchronous memory device 1 is triggered by the data output clock signal CLKDQ, and outputs data only when the latency signal LATENCY has been enabled.

The clock recovery circuit 30 shown by a dashed box in FIG. 1 includes a phase detector 32 and a variable-delay unit 34, and provides the data output clock signal CLKDQ in response to an external clock signal ECLK and a feedback clock signal CLKF. The replica circuit 40 provides the feedback clock signal CLKF whose time difference with respect to the data output clock signal CLKDQ is substantially identical to the time period tSAC that it takes the data output buffer 20 to output data received from the memory cell array 10 in response to the data output clock signal CLKDQ.

The read command buffer 50 provides an internal read signal PREAD after a delay of a predetermined time tREAD in response to the external clock signal ECLK and the read command READ CMD. The clock delay circuit 70 receives the data output clock signal CLKDQ and provides a plurality of transfer signals TR1, TR2, TR3 and TR4 having predetermined time differences with respect to the data output clock signal CLKDQ. The mode register 80 stores an external mode register set command MRS CMD. In this case, the mode register set command MRS CMD represents the mode of the synchronous memory device 1. The CAS latency CLi, where "i" is an integer, is determined by the mode register set command MRS CMD.

The latency circuit 90 receives the internal read signal PREAD, and provides latency signals LATENCY delayed by predetermined times, corresponding to the CAS latency CLi, with respect to the internal read signal PREAD in response to the transfer signals TR1, TR2, TR3 and TR4. In general, when the first transfer signal TR1 is provided to the latency circuit 90 at substantially the same time as the internal read signal PREAD, it is possible to precisely sample the internal read signal PREAD.

In the conventional synchronous memory device 1, a predetermined time tREAD after which the read command READ CMD is input from the outside, and before which the internal read signal PREAD is provided to the latency circuit 90, can not be precisely determined. Furthermore, since the point at which the internal read signal PREAD is provided varies depending on process variables, such as Process, Voltage and Temperature (PVT), the points at which the transfer signals TR1, TR2, TR3 and TR4 are provided from the clock delay circuit 70 to the latency circuit 90 must be designed to have a timing margin in consideration of such variation. Since the timing margin decreases as the frequency of the external clock signal ECLK increases, it is difficult to design the transfer signals TR1, TR2, TR3 and TR4 to be provided at precise times through simulation.

SUMMARY OF THE INVENTION

According to an exemplary embodiment of the present invention a synchronous memory device includes a read command buffer providing a read signal in response to a read command, a replica circuit providing a transfer signal whose time difference with respect to the feedback clock signal is substantially identical to a period that it takes the read command buffer to provide the read signal, and a latency circuit receiving the read signal and providing a latency signal having a predetermined time difference corresponding to CAS latency with respect to the read signal in response to the transfer signal.

A synchronous memory device according to an exemplary embodiment of the present invention includes a clock recovery circuit generating a data output clock signal in response to an external clock signal and a feedback clock signal, a first replica circuit receiving the data output clock signal and providing a plurality of first transfer signals whose time differences with respect to the data output clock signal are shorter than a period that it takes a data output buffer to output data received from a memory cell array, and a feedback clock signal whose time difference with respect to the data output clock signal is substantially identical to a period that it takes the data output buffer to output data received from the memory cell array, a second replica circuit receiving the feedback clock signal and providing a second transfer signal whose time difference with respect to the feedback clock signal is substantially identical to a period that it takes a read command buffer to provide a read signal, and a latency circuit receiving the read signal, and providing latency signals in response to the second transfer signal and the plurality of first transfer signals.

A synchronous memory device according to an exemplary embodiment of the present invention includes a clock recovery circuit generating a data output clock signal in response to an external clock signal and a feedback clock signal, a first replica circuit receiving the data output dock signal and providing a feedback clock signal whose time difference with respect to the data output dock signal is substantially identical to a period that it takes a data output buffer to output data received from a memory cell array, a clock delay circuit receiving the data output clock signal and providing first transfer signals having predetermined time differences with respect to the data output clock signal, a second replica circuit receiving the feedback clock signal, and providing a second transfer signal whose time difference with respect to the feedback clock signal is substantially identical to a period that it takes a read command buffer to provide a read signal, and a latency circuit receiving the read signal, and providing latency signals in response to the second transfer signal and the first transfer signals.

BRIEF DESCRIPTION OF THE DRAWINGS

The present invention will become readily apparent to those of ordinary skill in the art when descriptions of exemplary embodiments thereof are read with reference to the accompanying drawings.

DESCRIPTION OF EXEMPLARY EMBODIMENTS

Figure 1:
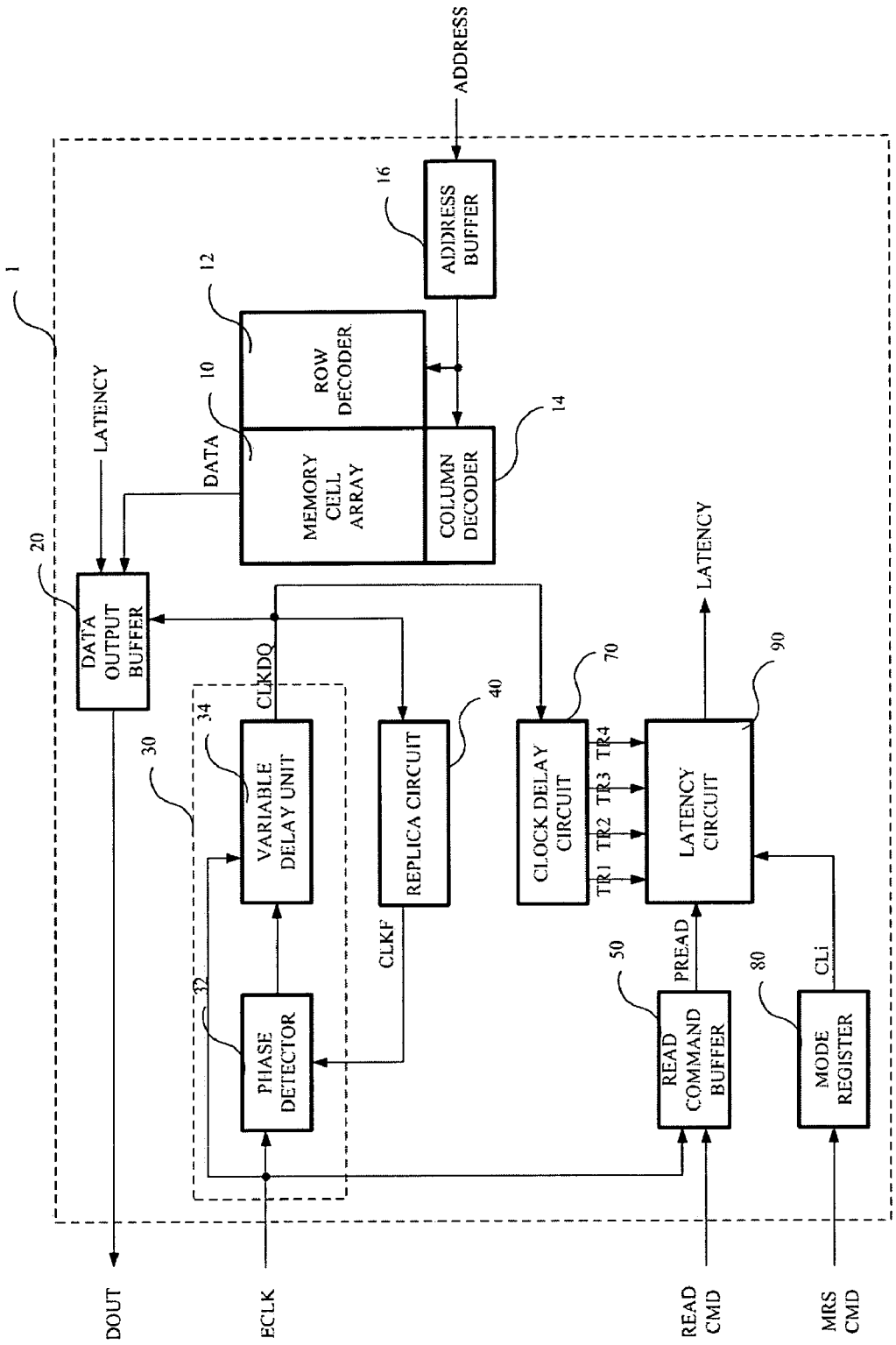
FIG. 1 is a block diagram illustrating a conventional synchronous memory device.

Hereinafter, exemplary embodiments of the present invention will be described with reference to the accompanying drawings. Like reference numerals refer to similar or identical elements throughout the description of the figures.

Figure 2:
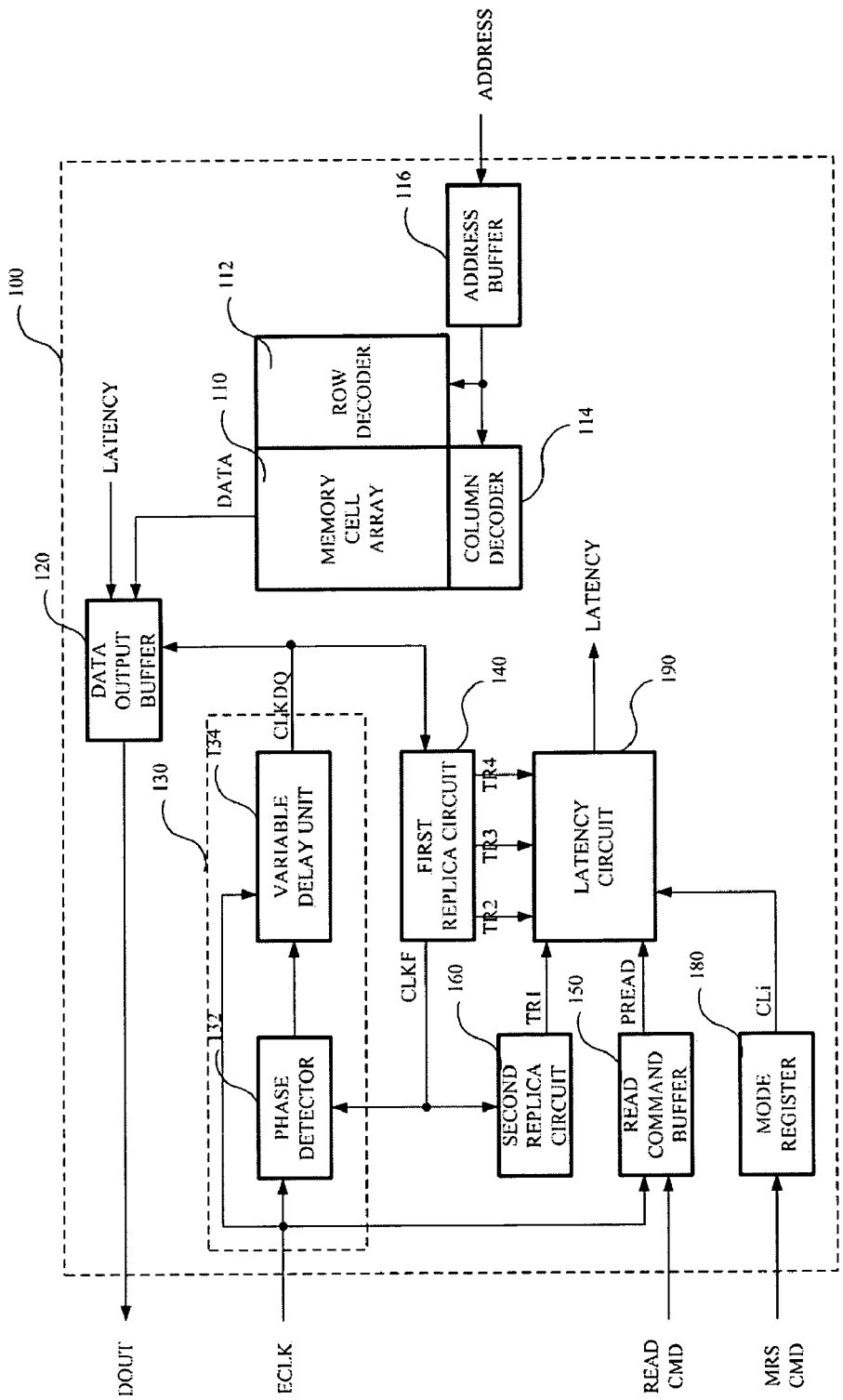
FIG. 2 is a block diagram illustrating a synchronous memory device according to an exemplary embodiment of the present invention.

FIG. 2 is a block diagram illustrating a synchronous memory device according to an exemplary embodiment of the present invention.

As illustrated in FIG. 2, the synchronous memory device 100 includes a memory cell array 110, a data output buffer 120, a clock recovery circuit 130, a first replica circuit 140, a read command buffer 150, a second replica circuit 160, a mode register 180, and a latency circuit 190.

Data DATA is written to the memory cell array 110, is read from the memory cell array 110, and is output. When a read command READ CMD is provided to the synchronous memory device 100, the data DATA is output from the memory cell array 110 corresponding to an externally-provided address ADDRESS (address provided from the outside). The address buffer 116 receives and temporarily stores the externally-provided address ADDRESS. A row decoder 112 receives the address ADDRESS stored in the address buffer 116, and decodes the row address of the memory cell array 110 from the address ADDRESS. The column decoder 114 receives the address stored in the buffer 116, and decodes the column address of the memory cell array 110 from the address ADDRESS. The memory cell array 110 outputs data from the memory cell designated by the row and column addresses.

The data output buffer 120 receives the data DATA from the memory cell array 110, and outputs the received data DATA in response to a latency signal LATENCY output from the latency circuit 190 and an output clock signal CLKDQ output from the data clock recovery circuit 130. For example, the data output buffer 120 of the synchronous memory device 100 is triggered by the output clock signal CLKDQ, and outputs data only when the latency signal LATENCY has been enabled.

The clock recovery circuit 130 generates the data output clock signal CLKDQ in response to an external clock signal ECLK. The external clock signal ECLK may be a reference clock signal for a number of the commands of the memory device 100, but exemplary embodiments of the present invention are not limited thereto. Although the clock recovery circuit 130 may be embodied as a Delay Locked Loop (DLL, it is to be understood that any other means capable of providing clocks, such as for example, a Phase Locked Loop (PLL) or a Synchronous Mirror Delay (SMD), should also be suitable. Descriptions of a DLL circuit are disclosed in, for example, U.S. Pat. Nos. 5,796,673, 6,145,073, 6,150,856, 6,194,916, 6,218,877, 6,229,363, 6,313,674, and 6,316,976, and descriptions of a PLL circuit are disclosed in, for example, U.S. Pat. Nos. 5,754,838, 6,057,739, and 6,278,641, and further description thereof will be omitted in the interests of clarity and simplicity.

The clock recovery circuit 130 shown by a dashed box in FIG. 2 includes a phase detector 132 and a variable-delay unit 134. The clock recovery circuit 130 generates the data output clock signal CLKDQ, the phase of which leads that of the external clock signal ECLK. That is, the data output clock signal CLKDQ has the same frequency as the external dock signal ECLK, but the pulses of the data output clock signal CLKDQ lead the pulses of the external clock signal ECLK by the data output period tSAC. It takes the data output period tSAC the data output buffer 120 to output data. According to an exemplary embodiment of the present invention, the clock recovery circuit 130 causes the data DOUT from the data output buffer 120 to be synchronized with the external clock signal ECLK.

In an exemplary embodiment of the present invention, the first replica circuit 140 provides a plurality of transfer signals TR2, TR3 and TR4 whose time differences with respect to the data output clock signal CLKDQ are shorter than the period tSAC that it takes the data output buffer 20 to output the data received from the memory cell array 110 in response to the data output clock signal CLKDQ. Since the first replica circuit 140 is formed of a circuit having substantially the same delay time as the data output buffer 120, the delay time tSAC of the first replica circuit 140 also varies depending on PVT process variables in basically the same manner, although the delay time of the data output buffer 120 varies depending on the PVT process variables. The transfer signals TR2, TR3, and TR4 are signals in which variation in the delay time tSAC of the data output buffer 120 is reflected.

The first replica circuit 140 provides a feedback clock signal CLKF whose time difference with respect to the data output clock signal CLKDQ is substantially identical to the period tSAC that it takes the data output buffer 120 to output the data received from the memory cell array 110. The feedback clock signal CLKF may be a signal precisely delayed by tSAC with respect to the data output clock signal CLKDQ, or a signal in which a predetermined timing margin as well as tSAC are considered. The feedback clock signal CLKF may have the same frequency and substantially the same phase as the external clock signal ECLK.

Hereinafter, the first replica circuit 140 will be described with reference to FIG. 3.

The read command buffer 150 provides a read signal PREAD in response to the external clock signal ECLK and the read command READ CMD. In this case, the read command buffer 150 can be provided with the external clock signal ECLK as in the embodiment of the present invention, but is not limited to this.

Although not shown as such in the drawings, the read command buffer 150 may include an internal clock generator and a read command buffer. The internal clock generator receives the external clock signal ECLK and generates an internal clock signal PCLK from the external clock signal ECLK. In an exemplary embodiment of the present invention, the internal clock signal PCLK is the buffered signal of the external clock signal ECLK. For example, the internal clock signal PCLK has the same frequency as the external clock signal ECLK, but is delayed by a predetermined time with respect to the external clock signal ECLK. The swing level of the internal clock signal may be a CMOS level. The internal clock signal PCLK can be used for the control of peripheral circuits, such as for example, a data sense amplifier (not shown) or a data multiplexer (not shown) within the memory device 100. The read command buffer 150 receives the read command READ CMD synchronized with the internal clock signal PCLK, and then outputs the read signal PREAD. The read signal PREAD is provided to the latency circuit 190.

The second latency circuit 160 receives the feedback clock signal CLKF. The second latency circuit 160 provides an entry transfer signal TR1 whose time difference with respect to the feedback clock signal CLKF is substantially identical to the period tREAD that it takes the read command buffer 150 to provide the read signal PREAD. The entry transfer signal TR1 may be a signal precisely delayed by tREAD with respect to the feedback clock signal CLKF, or the entry transfer signal TR1 may be a signal in which a predetermined timing margin as well as tREAD are considered. The entry transfer signal TR1 is provided to the latency circuit 190 and is used to initially sample the read signal PREAD.

In an exemplary embodiment of the present invention, the entry transfer signal TR1 is a signal delayed by the period tREAD with respect to the feedback clock signal CLKF, the feedback clock signal CLKF having substantially the same phase as the external clock signal ECLK, and the read signal PREAD is also a signal delayed by tREAD with respect to the external clock signal ECLK in the read command buffer 150, which can be provided to the latency circuit 190 at the same time.

Furthermore, since the second replica circuit 160 is formed of a circuit having substantially the same delay time tREAD as the read command buffer 150, the delay time of the second replica circuit 160 also varies depending on the PVT process variables in the same manner, although the delay time of the read command buffer 150 varies depending on the PVT process variables. As a result, the entry transfer signal TR1 is a signal in which variation in the delay time tREAD of the read command buffer 150 is reflected.

Hereinafter, the second replica circuit 160 will be described with reference to FIG. 4.

The memory device 100 includes various operation modes. A mode register 180 stores a mode register set command MRS CMD which is applied to the memory device 100. The MRS command MRS CMD represents the mode of the memory device 100. CAS latency CLi, where i is a natural number, is determined by the MRS command MRS CMD.

The latency circuit 190 receives the read signal PREAD, and provides latency signals LATENCYs in response to the entry transfer signal TR1 and the plurality of signals TR2, TR3 and TR4, respectively. The latency circuit 190 can provide different latency signals LATENCYs depending on CAS latency CLi provided by the mode register 180. That is, when the CAS latency is large, a latency signal having a delay time which is longer than that of the read signal PREAD is provided, and when the CAS latency is small, a latency signal having a delay time which is shorter than that of the read signal PREAD is provided.

The read signal PREAD and the entry transfer signal TR1 are input to the latency circuit 190 at substantially the same time. As a result, after the input of a read command READ CMD from the outside, the time tREAD after which the read signal PREAD is provided to the latency circuit 190 is precisely determined, and then the read signal PREAD is sampled.

Furthermore, the read signal PREAD is sampled by the entry transfer signal TR1, and a latency signal is provided in response to the transfer signals TR2, TR3 and TR4 in which the PVT process variables of the data output buffer 120 are reflected.

According to an exemplary embodiment of the present invention, the entry transfer signal TR1 and the plurality of transfer signals TR2, TR3 and TR4 are provided from the first and second replica circuits 140 and 160, and the latency circuit 190 can be designed to have only a minimum margin, regardless of variation in PVT process variables.

A detailed description of the latency circuit 190 is given below with reference to FIG. 5.

Figure 3:
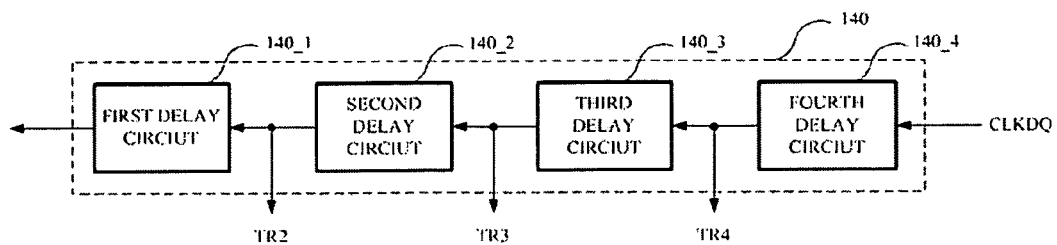
FIG. 3 is a block diagram illustrating the first replica circuit of FIG. 2, according to an exemplary embodiment of the present invention.

FIG. 3 is a block diagram illustrating the first replica circuit of FIG. 2, according to an exemplary embodiment of the present invention.

Referring to FIG. 3, the first replica circuit 140 includes a plurality of delay circuits 140_1, 140_2, 140_3 and 140_4. In detail, since the first replica circuit 140 must realize a delay time identical to the period tSAC which it takes the data output buffer (reference numeral 120 of FIG. 2) to output data received from a memory cell array (reference numeral 100 of FIG. 2), the first replica circuit 140 may have the same construction as the data output buffer 120, but is not limited to this. That is, as illustrated in FIG. 3, the first replica circuit 140 includes the plurality of delay circuits 140_1, 140_2, 140_3 and 140_4 and, thereby, can realize a delay time identical to tSAC by adjusting the phase of the data output clock signal CLKDQ.

In an exemplary embodiment of the present invention, the first replica circuit 140 provides the plurality of transfer signals TR2, TR3 and TR4 whose time differences with respect to the data output clock signal CLKDQ are shorter than the period tSAC, and the feedback clock signal CLKF whose time difference with respect to the data clock signal CLKDQ is substantially identical to tSAC. That is, when the data output clock signal CLKDQ has passed through the plurality of delay circuits 140_1, 140_2, 140_3 and 140_4 and is then provided, the feedback clock signal delayed by substantially identical to tSAC is provided, and when the data output clock signal CLKDQ has passed through different numbers of delay circuits 140_1, 140_2, 140_3 and 140_4, the transfer signals TR2, TR3 and TR4 having different delay times which are shorter than tSAC are provided. The second, third and fourth transfer signals TR2, TR3 and TR4 have long delay times in descending order of the length of delay time.

Figure 4:
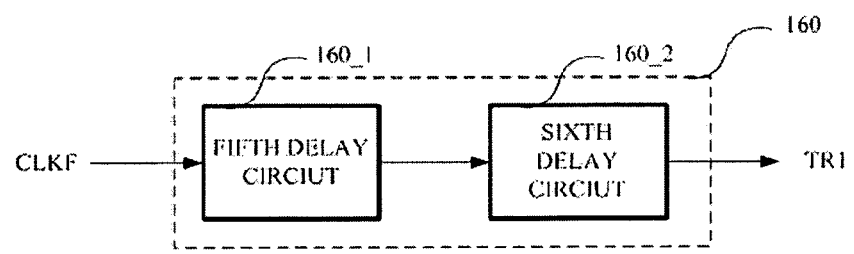
FIG. 4 is a block diagram illustrating the second replica circuit of FIG. 2, according to an exemplary embodiment of the present invention.

FIG. 4 is a block diagram illustrating the second replica circuit of FIG. 2, according to an exemplary embodiment of the present invention.

Referring to FIG. 4, the second replica circuit 160 includes a plurality of delay circuits 160_1 and 160_2. In detail, since the second replica circuit 160 must realize delay time identical to the period tSAC which it takes the read command buffer (reference numeral 150 of FIG. 2) to provide the read signal PREAD, the second replica circuit 160 may have the same construction as the read command buffer 150. For example, the fifth delay circuit 160_1 may be the same as an internal dock generator which buffers an external clock signal and provides an internal clock signal, and the sixth delay circuit 160_2 may be the same as a read command buffer which receives a read command synchronized with an internal clock signal and provides a read signal. However, the second replica circuit 160 is not limited to this, and includes the plurality of delay circuits 160_1 and 160_2 which can realize a delay time tREAD, and, thereby, provides the entry transfer signal TR1 by adjusting the phase of the feedback clock signal CLKF.

Figure 5:
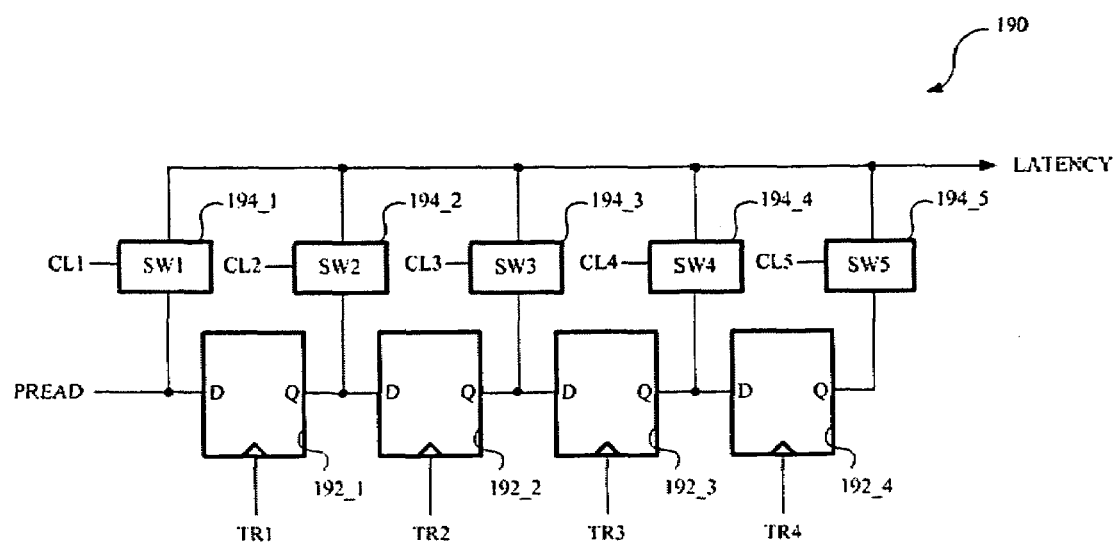
FIG. 5 is a circuit diagram illustrating the latency circuit of FIG. 2, according to an exemplary embodiment of the present invention.

FIG. 5 is a circuit diagram illustrating the latency circuit of FIG. 2, according to an exemplary embodiment of the present invention.

Referring to FIG. 5, the latency circuit 190 includes a plurality of flip-flop circuits 192_1, 191_2, 191_3 and 191_4 connected in series. Each of the flip-flop circuits 192_1, 191_2, 191_3 and 191_4 operates in response to the entry transfer signal TR1 and the transfer signals TR2, TR3 and TR4. In other words, the entry transfer signal TR1 having the delay time tREAD is applied to the first flip-flop circuit 192_1, to which the read signal PREAD is input, and the transfer signals TR2, TR3 and TR4 are respectively input to the second to fourth flip-flop circuits 192_2, 192_3 and 192_4 in descending order of the length of delay time (in the order of TR2, TR3 and TR4).

The latency circuit 190 is respectively connected to the input or output terminals of the plurality of flip-flop circuits 192_1, 192_2, 192_3 and 192_4 connected in series, and further includes a plurality of switches 194_1, 194_2, 194_3, 194_4 and 194_5 which are turned on in response to CAS latency signals CLi (i=1~5). Using the switches 194_1, 194_2, 194_3, 194_4 and 194_5, latency signals having different delay times depending on the mode of a synchronous memory device (reference numeral 100 of FIG. 2) can be provided.

In more detail, since one of the CAS latencies CLi (i=1~5) is input at a high level, only one of the plurality of switches 194_1, 194_2, 194_3, 194_4 and 194_5 is turned on, so that a signal is delivered as a latency signal. For example, when the CAS latency is 1, CL1 reaches a high level, so that only the first switch 194_1 is turned on and the remaining switches 194_2, 194_3, 194_4 and 194_5 are turned off. Then, the read signal PREAD is output as a latency signal LATENCY through the first switch 194_1. In another example, when the CAS latency is 2, CL2 reaches a high level, and CL1, CL3, CL4 and CL5 reach a low level. The read signal PREAD is sampled by the first flip-flop circuit 192_1 in response to the entry transfer signal TR1, and is output as a latency signal LATENCY through the second switch 194_2. Descriptions of the cases in which CL3, CL4 and CL5 reach a high level are omitted.

Although in the synchronous semiconductor device 100 of FIG. 2 according to an exemplary embodiment of the present invention, the CAS latency is 1, 2, 3, 4 and 5, it will be appreciated by those skilled in the art that the latency circuit 190 can be implemented by including more flip-flop circuits and switches when the CAS latency is six or more.

Operations of a synchronous semiconductor device according to an exemplary embodiment of the present invention will be described with reference to FIGS. 1 to 6. The timing diagram of FIG. 6 illustrates the case in which the CAS latency is five, as an example.

Figure 6:
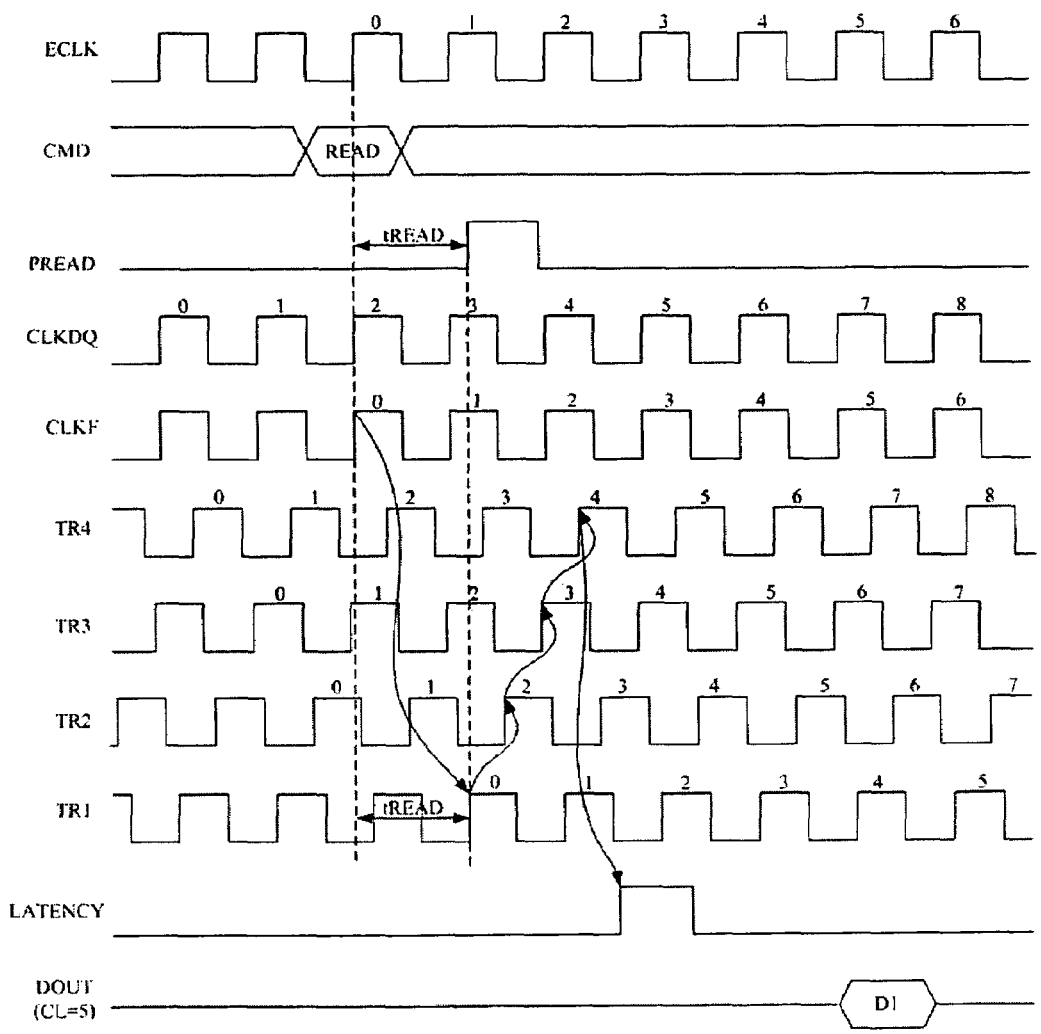
FIG. 6 is a timing diagram illustrating the operation of the synchronous memory device according to an exemplary embodiment of the present invention.

Referring to FIGS. 1 and 6, an external clock signal ECLK, a data output clock signal CLKDQ, a feedback clock signal CLKF, an entry transfer signal TR1, and a plurality of transfer signals TR2, TR3 and TR4 are shown. It will be appreciated by those skilled in the art that the relationship between the external clock signal ECLK, the data output clock signal CLKDQ and the feedback clock signal CLKF may be changed depending on the design.

The data output clock signal CLKDQ leads the external clock signal ECLK by a period tSAC. In this case, tSAC refers to the time that it takes a data output buffer to output data received from a memory cell array.

The plurality of transfer signals TR2, TR3 and TR4 are provided to a first replica circuit 140 and have different delay times each of which is shorter than tSAC with respect to that of the data output clock signal CLKDQ. In an exemplary embodiment of the present invention, the fourth transfer signal TR4 is delayed by the shortest time, and the second transfer signal TR2 is delayed by the longest time. As a result, the plurality of transfer signals TR2, TR3 and TR4 is generated to sequentially exhibit the rising edges thereof by being delaying by predetermined times with respect to the entry transfer signal TR1. In this case, the rising edges of the transfer signals TR2, TR3 and TR4 may have the same time interval. That is, the time interval between the rising edges of the entry transfer signal TR1 and the transfer signal TR2 may be the same as the time interval between the rising edges of the transfer signal TR2 and the transfer signal TR3. The transfer signals TR2, TR3 and TR4 can be generated by adjusting the delay times of the respective delay circuits 140_1, 140_2, 140_3 and 140_4 of the first replica circuit 140 of FIG. 3.

The feedback dock signal CLKF is generated after having passed through all of the plurality of delay circuits 140_1, 140_2, 140_3 and 140_4 of the first replica circuit 140, and have substantially the same phase as the external clock signal ECLK.

The entry transfer signal TR1 may be substantially delayed by tREAD with respect to the feedback clock signal CLKF. That is, the entry transfer signal TR1 is delayed by tREAD, or the rising edge thereof may be delayed by a predetermined time with respect to the rising edge of the read signal PREAD in consideration only of a minimum margin. In this case, tREAD refers to a time period between the point at which the read command buffer 150 receives the read command READ CMD and the point at which the read signal PREAD is generated.

The read command READ CMD is input to the read command buffer 150 at pulse 0 of the external clock signal ECLK, and, after the delay time tREAD, the read signal PREAD is generated.

The first flip-flop circuit 192_1 of the latency circuit 190 precisely samples the read signal PREAD in response to the entry transfer signal TR1 which reaches a high level at substantially the same point as the read signal PREAD. In an exemplary embodiment of the present invention, even if the timing margin based on process variables such as PVT is not considered when the timing of the entry transfer signal TR1 is designed, the read signal PREAD can be precisely sampled.

As described above, the second replica circuit 160 is formed of a circuit having substantially the same delay time tREAD as the read command buffer 150, so that the delay time of the second replica circuit 160 also varies depending on the PVT process variables in basically the same manner; although the delay time of the read command buffer 150 varies depending on the PVT process variables.

The second flip-flop circuit 192_2 of FIG. 5 operates in response to the transfer signal TR2. The third flip-flop circuit 192_3 of FIG. 5 operates in response to the transfer signal TR3. The fourth flip-flop circuit 192_4 of FIG. 5 operates in response to the transfer signal TR4. For example, when the CAS latency is 5, CL5 reaches a high level, so that the output signal from the fourth flip-flop circuit 192_4 is output through the fifth switch 194_5 of FIG. 5 as a latency signal LATENCY.

Since the latency signal LATENCY has been enabled, the data output buffer 120 outputs first data D1 in response to the data output clock signal CLKDQ. It can be appreciated that the read command READ CMD is input at pulse 0 of the external clock signal ECLK, and the first data D1 is output after five cycles of the external clock signal ECLK in the case when CAS latency is five.

Figure 7:
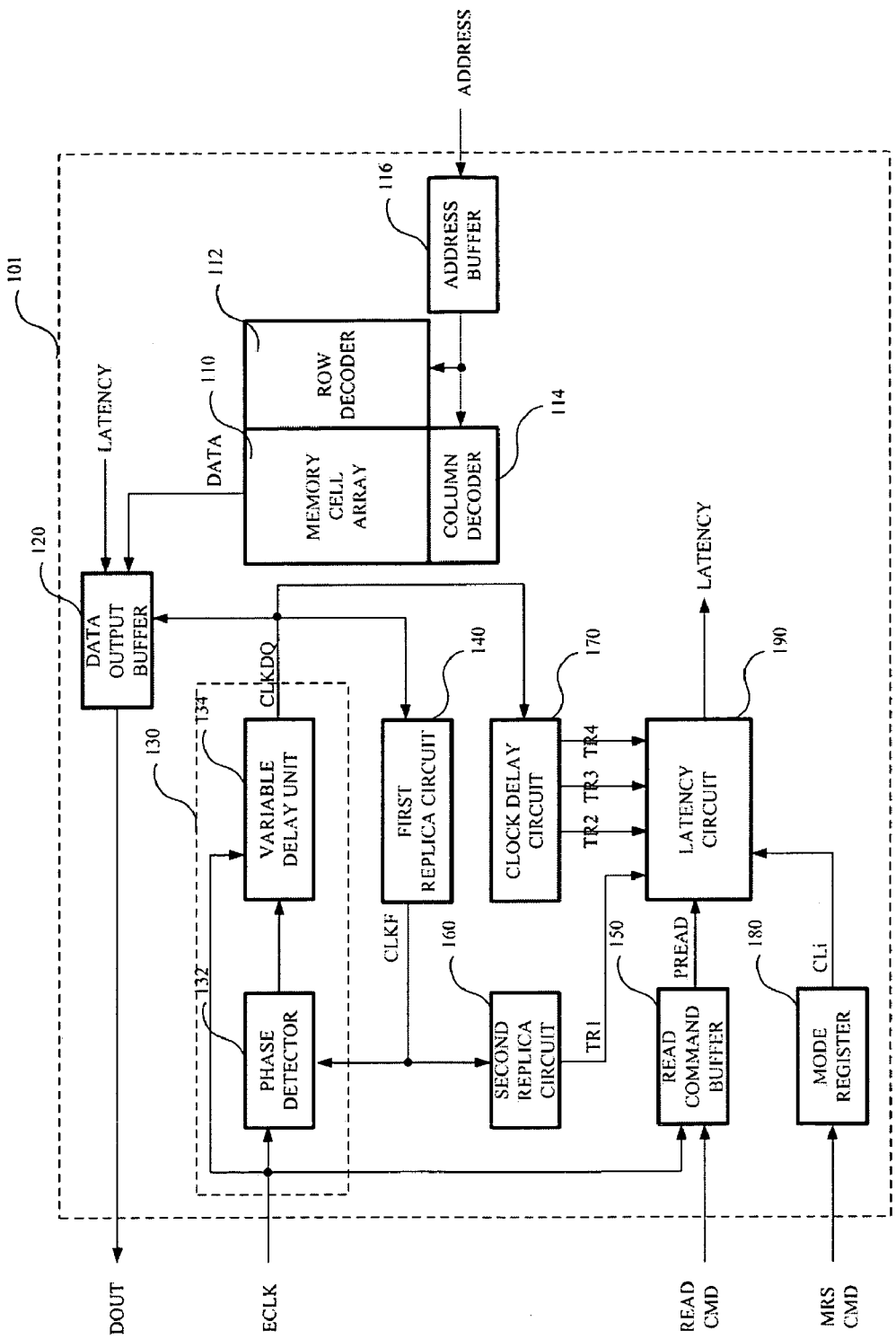
FIG. 7 is a block diagram illustrating the operation of the synchronous memory device according to an exemplary embodiment of the present invention.

FIG. 7 is a block diagram illustrating a synchronous memory device according to an exemplary embodiment of the present invention. In FIG. 7; elements that are substantially similar or identical to elements described in connection with FIG. 1 are labeled with the same reference numerals and further description of the corresponding elements is omitted.

Referring to FIG. 7, in a synchronous memory device 101, a plurality of transfer signals TR2, TR3 and TR4 are provided from a separate clock delay circuit 170, not from a first replica circuit 140.

The clock delay circuit 170 receives a data output clock signal CLKDQ, and provides transfer signals TR2, TR3 and TR4 whose time differences with respect to the data output clock signal CLKDQ are predetermined times.

In the synchronous memory device 101 according to an exemplary embodiment of the present invention, a second replica circuit 160 delays a feedback clock signal CLKF by the period tREAD that it takes a read command buffer 150 to output a read signal PREAD, and a latency circuit 190 can initially sample the read signal PREAD precisely. The transfer signals TR2, TR3 and TR4 are provided from the separate dock delay circuit 170.

According to an exemplary embodiment of the present invention, although process variables such as PVT may vary, a point at which a read signal is provided to a latency circuit is precisely determined, and the read signal is then sampled, minimizing a timing margin.

According to an exemplary embodiment of the present invention, although the frequency of an external clock signal increases, an entry transfer signal and transfer signals can be provided at precise times.

Although the exemplary embodiments of the present invention have been described in detail with reference to the accompanying drawings, it is to be understood that the inventive processes and apparatus should not be construed as limited thereby. It will be readily apparent to those of reasonable skill in the art that various modifications to the foregoing exemplary embodiments can be made without departing from the scope of the invention as defined by the appended claims, with equivalents of the claims to be included therein.

What is claimed is:

1. A synchronous memory device comprising:
a read command buffer providing a read signal in response to a read command;
a replica circuit providing an entry transfer signal in response to a feedback clock signal, the entry transfer signal having a time difference with respect to the feedback clock signal that is substantially identical to a period that it takes the read command buffer to provide the read signal; and
a latency circuit receiving the read signal and the entry transfer signal, and providing to the data output buffer a latency signal having a predetermined time difference corresponding to a column access strobe (CAS) latency with respect to the read signal in response to the entry transfer signal,
wherein the entry transfer signal is a delayed signal of the feedback clock signal.

2. The synchronous memory device as set forth in claim 1, wherein the latency circuit includes a plurality of flip-flop circuits connected in series, and wherein a first flip-flop circuit of the plurality of flip-flop circuits that receives the read signal operates in response to the transfer signal.

3. The synchronous memory device as set forth in claim 2, wherein the latency circuit includes a plurality of switches which are connected to input and/or output terminals of the plurality of flip-flop circuits, respectively, and are turned on in response to the CAS latency signal.

* * * * *